(12) United States Patent
Hanaoka (10) Patent No.: US 8,212,313 B2
(45) Date of Patent: Jul. 3, 2012

(54) SEMICONDUCTOR DEVICE

(75) Inventor: Masayuki Hanaoka, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 221 days.

(21) Appl. No.: 12/670,413

(22) PCT Filed: Jun. 24, 2008

(86) PCT No.: PCT/JP2008/061492
§ 371 (c)(1),
(2), (4) Date: Jan. 25, 2010

(87) PCT Pub. No.: WO2009/013967
PCT Pub. Date: Jan. 29, 2009

(65) Prior Publication Data
US 2010/0187603 A1    Jul. 29, 2010

(30) Foreign Application Priority Data
Jul. 24, 2007  (JP) .................................. 2007-192161

(51) Int. Cl.
*H01L 29/76* (2006.01)
(52) U.S. Cl. ........ 257/330; 257/331; 257/332; 257/334; 257/339; 257/E29.262
(58) Field of Classification Search .................. 257/330, 257/331, 332, 334, 339, E29.262
See application file for complete search history.

(56) References Cited

U.S. PATENT DOCUMENTS
2003/0001215 A1  1/2003  Wahl et al.
2005/0167748 A1  8/2005  Onda et al.

FOREIGN PATENT DOCUMENTS
| JP | 9 283754 | 10/1997 |
| JP | 11 87698 | 3/1999 |
| JP | 2003 515915 | 5/2003 |
| JP | 2005 32941 | 2/2005 |
| JP | 2005 209807 | 8/2005 |

*Primary Examiner* — Long Pham

(74) *Attorney, Agent, or Firm* — Oblon, Spivak, McClelland, Maier & Neustadt, L.L.P.

(57) ABSTRACT

Provided is a semiconductor device which can relax the electric field in the junction termination region, and can achieve a high breakdown voltage.

The semiconductor device includes an element region (51) and a junction termination region (52). The element region includes: a first semiconductor region (2) of a first conductivity type; a second semiconductor region (4) of a second conductivity type; a third semiconductor region (10) of the first conductivity type; a trench (35) passing through the second semiconductor region and the third semiconductor region and has a bottom surface which reaches the first semiconductor region (2); a gate insulating film (12) formed on the side surface and a bottom surface of the trench; and a gate electrode (8) embedded in the trench. The junction termination region includes: a terminal trench (55) formed in the depth direction from the top surface so as to surround the element region; a gate insulating film (12) formed on a sidewall and a bottom surface of the terminal trench; and a gate electrode (8) embedded in the terminal trench (55). The depth from the top surface of the second semiconductor region (4) to the bottom surface of the terminal trench (55) is 0.9 to 2.0 times the thickness of the second semiconductor region.

12 Claims, 6 Drawing Sheets

SEMICONDUCTOR DEVICE

TECHNICAL FIELD

The present invention relates to a semiconductor device, and in particular relates to a semiconductor device having the characteristic in the structure for high breakdown voltage.

BACKGROUND ART

As conventional technology, it is disclosed about a technology of providing a semiconductor element with a high breakdown voltage, without forming a thick diffusion layer (for example, refer to Patent Literature 1).

Figure 1:
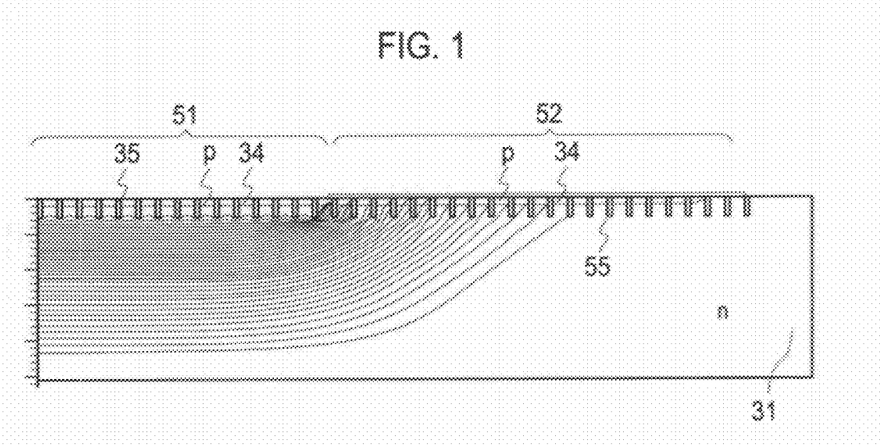
FIG. 1 A schematic diagram showing a potential distribution simulation result in the semiconductor device according to a conventional example (10 Volts/units)

The high breakdown voltage semiconductor device described in Patent Literature 1 has an element region 51 and a junction termination region 52 disposed on the perimeter of the element region 51, as shown in FIG. 1. In the element region 51 and the junction termination region 52, a p type base layer 34 is formed by a diffusion process on a surface of an n type base layer 31 having a high resistivity. A plurality of trenches 35 embedding a gate electrode are formed in the element region 51. A plurality of terminal trenches 55 having a continuous or a discontinuous ring shape are formed in the junction termination region 52, surrounding the element region 51. The terminal trench 55 passes through the p type base layer 34, and has the depth which reaches to the halfway of the n type base layer 31. The p type base layer 34 is divided into a plurality of parts electrically separated by the terminal trench 55, in the junction termination region 52.

In the high breakdown voltage semiconductor device described in Patent Literature 1, as shown in FIG. 1, the depth of each trenches (35, 55) is determined to be larger than the interval between the adjoining trenches (35, 55) (width of the p type base layer 34).

Patent Literature 1: Japanese Patent Application Laying-Open Publication No. H09-283754 (Pages 2-3, and FIG. 1)

DISCLOSURE OF INVENTION

Technical Problem

The present inventor executed a simulation of a potential distribution based on the conventional type structure shown in FIG. 1. In FIG. 1, the result is shown by using 10 Volts/units equipotential surface. In the high breakdown voltage semiconductor device described in Patent Literature 1, as shown in FIG. 1, the depth of the trenches 35 and 55 is determined to be larger than the width of the trenches 35 and 55. However, according to the simulation result shown in FIG. 1, since there are few effects of the electric field relaxation in the junction termination region 52, a desired breakdown voltage cannot be obtained.

Although the depth of each trenches (35, 55) is determined to be larger than the interval between the adjoining trenches (35, 55) (width of the p type base layer 34) in the high breakdown voltage semiconductor device described in Patent Literature 1, the present inventor found out that there is the electric field relaxation effect in the junction termination region 52 and the high breakdown voltage can be obtained for when determining the depth of each trenches (35, 55) to be smaller than the interval between the adjoining trenches (35, 55) (width of the p type base layer 34) conversely.

The purpose of the present invention is to provide a semiconductor device which can relax the electric field in the junction termination region, and can achieve a high breakdown voltage.

Solution to Problem

According to one aspect of the present invention for achieving the above-mentioned purpose, it is provided with a semiconductor device comprising a semiconductor base substance having a first semiconductor region having an impurity of a first conductivity type, and a second semiconductor region contacting a top surface of the first semiconductor region and having a second conductivity type different from the first conductivity type. The semiconductor base substance comprises: an element region, on which a switching element is formed; a terminal region formed so as to surround the element region when observed from an upper side; a trench formed in the depth direction from a top surface of the second semiconductor region of the terminal region; an insulating film formed on a sidewall and a bottom surface of the trench; and a first conductive layer embedded inside the trench via the insulating film. The depth of the trench from the top surface of the second semiconductor region to the bottom surface of the trench is 0.9 to 2.0 times the thickness of the second semiconductor region.

According to another aspect of the present invention, it is provided with a semiconductor device comprising a semiconductor base substance having a first principal surface and a second principal surface. The semiconductor base substance comprises: an element region on which a switching element is formed; and a terminal region formed so as to surround the element region when observed from an upper side. The element region has: a first semiconductor region having an impurity of a first conductivity type; a second semiconductor region contacting a top surface of the first semiconductor region, and having a second conductivity type different from the first conductivity type, a part of the second semiconductor region being exposed in the first principal surface; a third semiconductor region contacting a top surface of the second semiconductor region, and having a first conductivity type, a part of the third semiconductor region being exposed in the first principal surface; a trench passing through the second semiconductor region and the third semiconductor region from the first principal surface, a bottom surface of the trench reaching to the first semiconductor region; a first insulating film formed on a side surface and a bottom surface of the trench; a first conductive layer embedded inside the first insulating film; a control electrode electrically connected to the first conductive layer; a first electrode electrically connected to the first semiconductor region; and a third electrode electrically connected to the third semiconductor region. The terminal region has: a trench formed in the depth direction from a top surface so as to surround the element region, the second semiconductor region being exposed on the top surface; a second insulating film formed on a sidewall and a bottom surface of the aforementioned trench; and a second conductive layer embedded inside the aforementioned trench via the second insulating film. The depth of the trench from the top surface of the second semiconductor region to the bottom surface of the trench is 0.9 to 2.0 times the thickness of the second semiconductor region. The following formula is satisfied $$C3, C4 \gg C1, C2$$

where C1 is a capacitor between the second semiconductor region and the first semiconductor region, C2 is a capacitor between the first conductive layer and the first semiconductor region in the trench, and C3 and C4 are capacitors between the first conductive layer and the second semiconductor region, respectively, in each side walls of the trench.

ADVANTAGEOUS EFFECTS OF INVENTION

According to the semiconductor device of the present invention, the electric field in the junction termination region can be relaxed and the high breakdown voltage can be achieved.

REFERENCE SIGNS LIST

2: n⁻ type base layer (First semiconductor region);
3: n type buffer layer;
4, 34: p type base layer (Second semiconductor region);
5a: First principal surface;
5b: Second principal surface;
8: Gate electrode (First conductive layer, Second conductive layer);
10: n type emitter (source) region (Third semiconductor region);
12: Gate insulating film;
14, 18: Interlayer insulating film;
16: Emitter (source) electrode;
20: Field plate electrode;
22: Extraction electrode;
31: n type base layer;
35: Trench;
51: Element region;
52: Junction termination region; and
55: Terminal trench.

DESCRIPTION OF EMBODIMENTS

Next, an embodiment of the invention is described with reference to drawings. In the following drawings, the same or similar reference numeral is attached to the same or similar. However, a drawing is schematic and it should be cared about differing from an actual thing. Drawings are schematic, not actual, and may be inconsistent in between in scale, ratio, etc.

Moreover, the embodiment shown in the following exemplifies the device and method for materializing the technical idea of the invention, and the technical idea of the invention does not specify assignment of each component parts, etc. as the following. Various changes can be added to the technical idea of the invention in scope of claims.

First Embodiment

Figure 2:
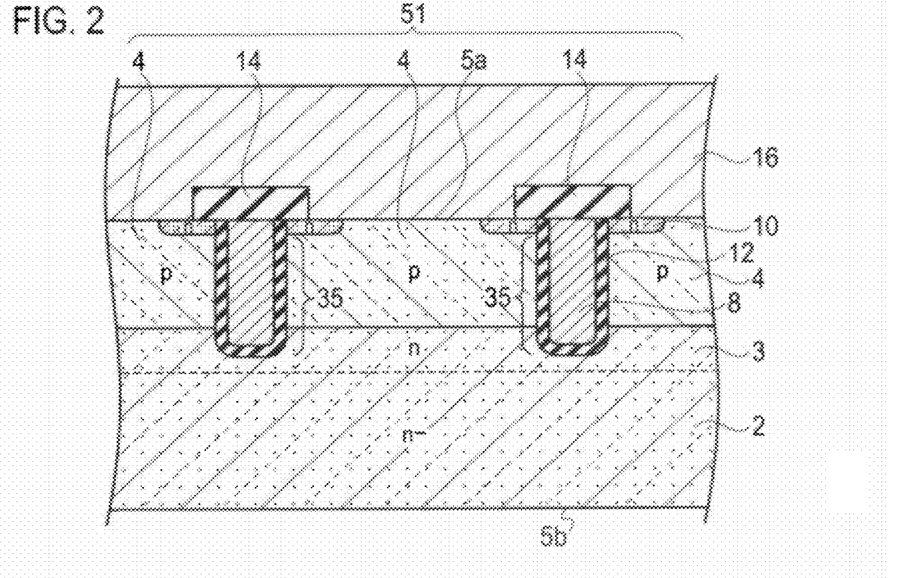
FIG. 2 A schematic cross-sectional configuration diagram of an element region of a semiconductor device according to a first embodiment of the present invention FIG. 3 A schematic cross-sectional configuration diagram of a junction termination region of the semiconductor device according to the first embodiment of the present invention FIG. 4 A model diagram of a capacitor of each part of the junction termination region of the semiconductor device according to the first embodiment of the present invention FIG. 5 A schematic diagram showing a potential distribution simulation result in the case of determining the trench depth shallower, in the semiconductor device according to the first embodiment of a present invention (10 Volts/units)
Figure 3:
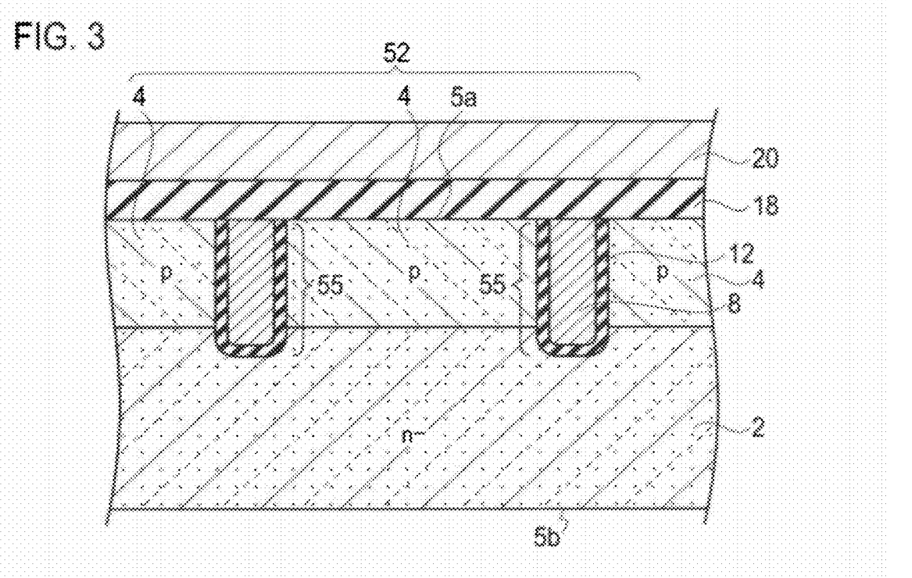

A schematic cross-section structure of an element region 51 of a semiconductor device according to a first embodiment of the present invention is expressed as shown in FIG. 2. Moreover, a schematic cross-section structure of a junction termination region 52 of the semiconductor device according to the first embodiment is expressed as shown in FIG. 3. In the above, the element region 51 and the junction termination region 52 are shown schematically by enlarging the part, and are formed and disposed continuously to the horizontal direction and the back and front direction of the drawing. Moreover, when observing the drawing from a top surface, the junction termination region 52 is disposed so that the element region 51 may be surrounded.

The element region 51 of the semiconductor device according to the first embodiment is disposed on a semiconductor base substance having a first principal surface 5a and a second principal surface 5b. As shown in FIG. 2, the aforementioned semiconductor base substance includes: a first semiconductor region (n⁻ type base layer) 2 having an impurity of a first conductivity type; a second semiconductor region (p type base layer) 4 contacted with a top surface of the first semiconductor region 2, and exposing a part in the first principal surface 5a, and having a second conductivity type different from the first conductivity type; a third semiconductor region (n type emitter region) 10 contacted with a top surface of the second semiconductor region 4, and exposing a part in the first principal surface 5a, and having the first conductivity type; a trench 35 passing through the second semiconductor region 4 and the third semiconductor region 10 from the first principal surface 5a, and is configured to reach a bottom surface of the trench 35 to the first semiconductor region 2; a gate insulating film 12 formed on a side surface and a bottom surface of the trench 35; a gate electrode (first conductive layer) 8 embedded inside the gate insulating film 12; a control electrode (not shown) electrically connected with the gate electrode 8; a first electrode (collector electrode) (not shown) electrically connected with the first semiconductor region 2;

and a third electrode 16 (emitter electrode) electrically connected with the second semiconductor region 4 and the third semiconductor region 10.

In the semiconductor device shown in FIG. 2, when composed as an IGBT (Insulated Gate Bipolar Transistor), a fourth semiconductor region (collector region) having the second conductivity type is further disposed on the second principal surface 5b of the first semiconductor region 2. In the case of the IGBT, the second semiconductor region 4 and the third semiconductor region 10 act as a base region and an emitter region, respectively.

On the other hand, in the semiconductor device shown in FIG. 2, when composed as a MISFET (Metal Insulator Semiconductor Field Effect Transistor), it is preferable to further dispose the fourth semiconductor region (drain region) having the first conductivity type on the second principal surface 5b of the first semiconductor region 2. In the case of the MISFET, the second semiconductor region 4 and the third semiconductor region 10 act as a base region and a source region, respectively.

Also in the case of the IGBT, or in the case of the MISFET, it is the same that an n channel region is formed near the interface of the p type base layer 4 of MIS structure composed of gate electrode (8)/gate insulating film (12)/p type base layer (4) in a conductive state.

Moreover, as shown in FIG. 2, it is effective also as a configuration for preventing the punching through between the adjoining p type base layers 4, and regulating the channel length of n channel MIS structure clearly, by making the n type buffer layer 3 intervene between the p type base layer 4 and the n⁻ type base layer 2.

Moreover, as shown in FIG. 2, in the upper part of the trench 35, an interlayer insulating film 14 is disposed on the upper part of the n type emitter (source) region 10, the gate insulating film 12, and the gate electrode 8. The interlayer insulating film 14 can also be formed by a homogeneous material and a simultaneous process as the interlayer insulating film 18 in the junction termination region 52 described later.

As shown in FIG. 3, the junction termination region 52 formed so that the element region 51 may be surrounded when observing the semiconductor device according to the first embodiment from the upper side includes: a first semiconductor region (n⁻ type base layer) 2 having an impurity of a first conductivity type; a second semiconductor region (p type base layer) 4 contacted with a top surface of the first semiconductor region 2 and having a second conductivity type different from the first conductivity type; a terminal trench 55 composed of a trench formed in the depth direction from a top surface of the second semiconductor region 4 (first principal surface 5a); a gate insulating film 12 formed on a sidewall and a bottom surface of the terminal trench 55; and a gate electrode (second conductive layer) 8 embedded inside the terminal trench 55 via the gate insulating film 12. The depth WT from the top surface of the second semiconductor region 4 to the bottom surface of the trench of the terminal trench 55 is 0.9 to 2.0 times the thickness WB of the second semiconductor region.

The junction termination region 52 of the semiconductor device according to the first embodiment further includes an interlayer insulating film 18 disposed on the top surface of the second semiconductor region 4 (first principal surface 5a), and a field plate electrode 20 disposed on the interlayer insulating film 18, as shown in FIG. 3.

As shown in FIGS. 2 and 3, in the semiconductor device according to the first embodiment of the present invention, the gate electrode 8 composed of the first conductive layer in the element region 51 and the gate electrode 8 composed of the second conductive layer in the junction termination region 52 may be formed of a trench structure with which polysilicon is filled up by a simultaneous process.

In the semiconductor device according to the first embodiment, the p type base layer 4 in the element region 51 and the p type base layer 4 in the junction termination region 52 can be formed by a simultaneous process.

Moreover, as shown in FIG. 3, in the semiconductor device according to the first embodiment, the terminal trench 55 in the junction termination region 52 is formed in a ring shape, surrounding the element region 51 when observing the drawing from an upper side. Furthermore, in the junction termination region 52, the p type base layer 4 formed by a diffusion process in the periphery is divided and formed in a ring shape.

Figure 4:
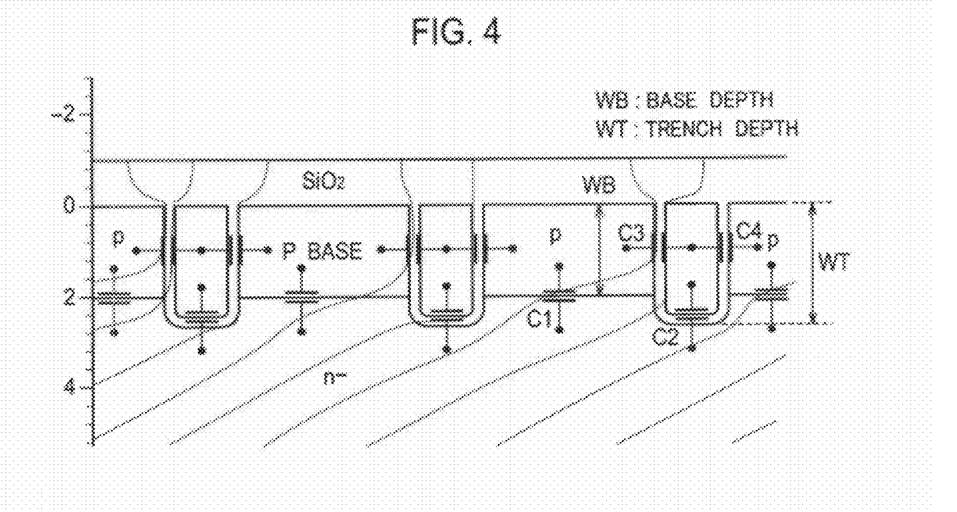

A model of capacitor of each part in the structure of the junction termination region 52 of the semiconductor device according to the first embodiment is expressed as shown in FIG. 4.

When a voltage is applied to a device with the periphery structure where the p type base layer 4 is divided and formed in a ring shape, the potential of each part can be analyzed also as a distributed constant circuit of capacitors, as shown in FIG. 4.

As a semiconductor device according to the first embodiment, in the IGBT or the MISFET as shown in FIG. 2, when collector voltage or drain voltage is applied to near the predetermined limit value of a breakdown voltage, a depletion layer is formed in the n⁻ type base layer 2 (n⁻ drain region) as schematically shown in FIG. 4. Moreover, since the thin gate insulating film 12 is formed between the p type base layer 4 and the gate electrodes 8 in the terminal trench 55, it is preferable to satisfy the relation of formula (1) between capacitors C3, C4, C1, and C2, as described later.

In this case, the potential distribution near the surface is determined by the capacitive coupling between the p type base layer 4 connected in series and polysilicon (gate electrode 8) in the terminal trench 55.

If this property is used, the potential distribution of the periphery can be controlled arbitrary.

As shown in FIG. 4, the base depth indicating the thickness of the p type base layer 4 is defined by WB, and the trench depth is defined by WT. C1 denotes a capacitor between the p type base layer 4 and the n⁻ type base layer 2. C2 denotes a capacitor between the gate electrode 8 in trench structure and the n⁻ type base layers 2. C3 and C4 denote capacitors between the gate electrode 8 in trench structure, and the p type base layers 4. Between the capacitors of each part mentioned above, it is preferable to satisfy the relation of the following formula.

$$C3, C4 \gg C1, C2 \qquad (1)$$

Figure 5:
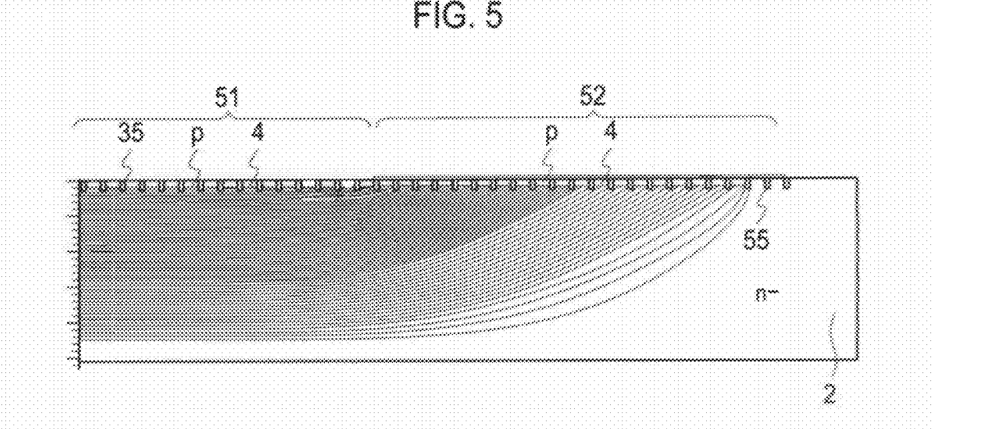

Moreover, in the semiconductor device according to the first embodiment, a schematic diagram of the simulation result of the potential distribution in the case of determining the trench depth shallower is expressed as shown in FIG. 5. That is, in FIG. 5, there is the electric field relaxation effect in the junction termination region 52, and a high breakdown voltage can be obtained, only by determining the depth of each trenches (35, 55) shallower than the interval between the adjoining trenches (35, 55) (width of the p type base layer 4), without optimizing the interval between the p type base layers 4. In FIG. 5, each line is shown by 10 Volts/units.

Figure 6:
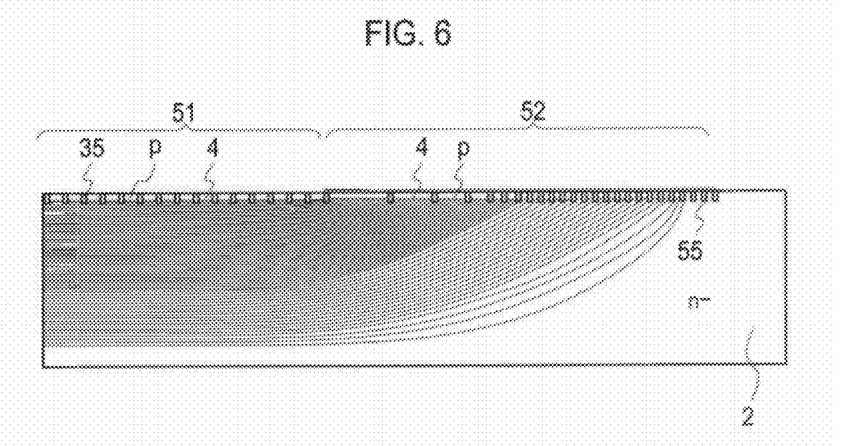
FIG. 6 A schematic diagram showing a potential distribution simulation result in the case of determining the trench depth shallower and optimizing the interval between p type base layers, in the semiconductor device according to the first embodiment of the present invention (20 Volts/units)

Furthermore, in the semiconductor device according to the first embodiment, FIG. 6 shows a schematic diagram of the simulation result of the potential distribution in the case of determining the depth of each trenches (35, 55) shallower than the interval between the adjoining trenches (35, 55) (width of the p type base layer 4), with optimizing the interval between the p type base layers 4. That is, FIG. 6 shows the simulation result which optimizes and determines the division width of the p type base layer 4 of each part of the periphery so that the high breakdown voltage can be obtained.

In FIG. 6, each line is shown by 20 Volts/units. As clearly seen from FIG. 6, when the depth of each trenches (35, 55) is determined to be shallower than the interval between the adjoining trenches (35, 55) (width of the p type base layer 4) and the interval between the p type base layers 4 is optimized, the electric field relaxation effect near the element region 51 is obtained remarkably, and the equipotential surface is uniformly extended to the junction termination region 52 distanced from the element region 51.

Figure 7:
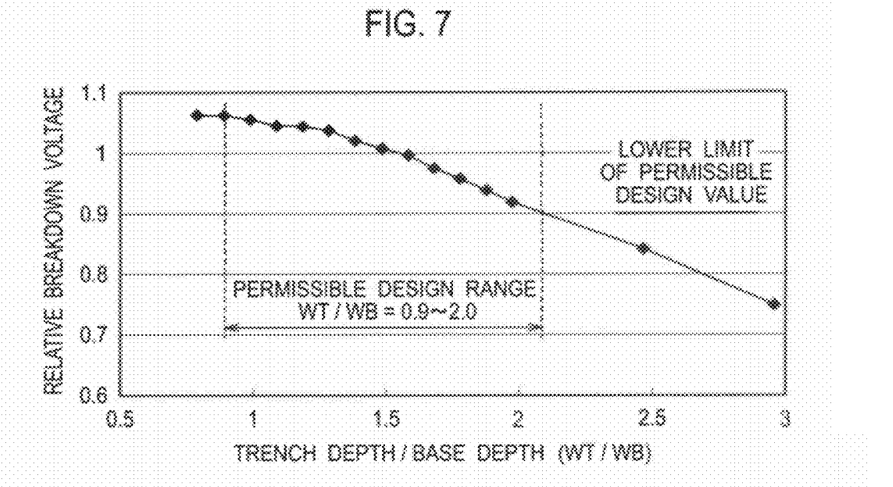
FIG. 7 A characteristics diagram showing the relation between the relative breakdown voltage and the trench depth/base depth (WT/WB)

The relation between a relative breakdown voltage and the trench depth/base depth (WT/WB) is expressed as shown in FIG. 7. As clearly seen from FIG. 7, as for the value of the trench depth/base depth (WT/WB), it is proved that a desired relative breakdown voltage is obtained, in the range of about 0.9 to 2.0 of the permissible design value, for example.

Figure 8:
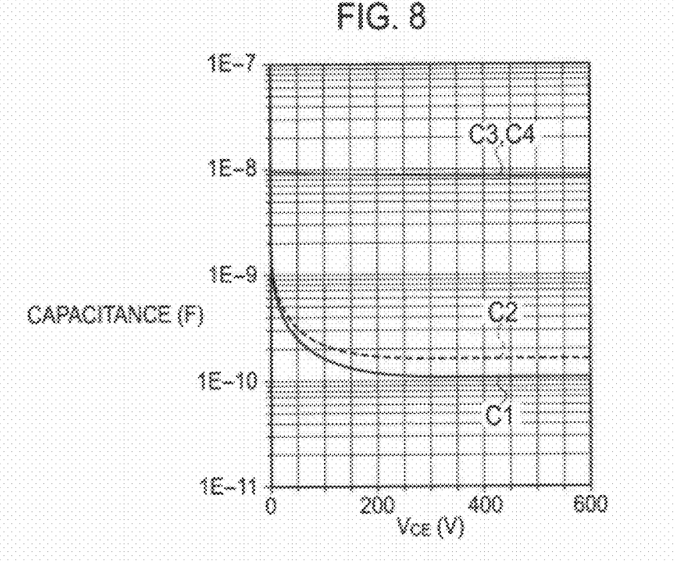
FIG. 8 A characteristics diagram showing the relation between the value of the capacitance for the capacitors C1 to C4 and a collector voltage VCE (V) corresponding to FIG. 4

FIG. 8 shows the relationship between the value of the capacitance for the capacitors C1 to C4 and the collector voltage VCE (V) corresponding to FIG. 4 in the case of determining the depth of each trenches (35, 55) shallower than the interval between the adjoining trenches (35, 55) (width of the p type base layer 4), and optimizing the interval between the p type base layers 4, in the semiconductor device according to the first embodiment. In the case of the IGBT structure, when the collector voltage VCE=600 volt is applied, the result of the following formula is obtained in WT/WB=1.3.

$$C1:C2:C3:C4=1:1.5:79:79 \qquad (2)$$

That is, the relation of formula (1) is satisfied.

In order to achieve the simulation result which is shown in FIG. 6 and is determined by optimizing the division width of the p type base layer 4 of each part of the periphery so that the high breakdown voltage could be obtained, it is necessary to reduce the ratio (WB:WT) between the diffusing depth WB of the p type base layer 4 and the trench depth WT to about 1:0.9 to 1:2.0.

It is because the capacitor (C2) between the gate electrode 8 and the n⁻ type base layer 2 becomes large since the size of the side surface of the terminal trench 55 increases if the depth WT of the terminal trench 55 is thick, and therefore the conditions (C3, C4>>C1, C2) of the formula (1) which is a premise of potential distribution controllable are not satisfied.

Also in the case of WB:WT=1:0.9, i.e., when the trench depth WT is shallower than the depth WB of the p type base layer 4, the p type base layer 4 is divided by the spreading of the depletion layer from the pn junction between the p type base layer 4/n⁻ type base layers 2 by an application of a collector voltage VCE (V), and therefore an equivalent effect can be expected. However, it is preferable that it is determined as WT/WB>1, in order to fully obtain the effect of the semiconductor device according to the first embodiment of the present invention.

(Periphery Structure)

In the semiconductor device according to the first embodiment, a periphery structure can be implemented combining a plurality of following configurations multiple, optimized and calibrated.

(a) The division size of the p type base layer 4 in the junction termination region 52 is determined appropriately. That is, a high breakdown voltage can be obtained at the location near the element region 51 by determining the width of the p type base layer 4 relatively wide, and determining the width of the p type base layer 4 relatively narrow according to distant from the element region 51.

(b) When usable two or more kinds of the thickness of the gate insulating film 12 at the trench sidewall, if the relatively thin gate insulating film 12 is used for the trench near the element region 51 and the relatively thick gate insulating film 12 is used for the trench according to distant from the element region 51, for example, the value of the capacity C1 becomes large so as to close to the element region 51, in the junction termination region 52. On the other hand, the electrical potential change in the location near the element region 51 becomes small against the positional change from the element region 51 to the distant direction, and the electric field is relaxed.

Although the value of the electrical potential change in the location distant from the element region 51 is large and the value of the electric field increases, the device breakdown in the location distant from the element region 51 is not occurred since the potential difference between the p type base layer 4 and the n⁻ base layer 2 is small.

Figure 9:
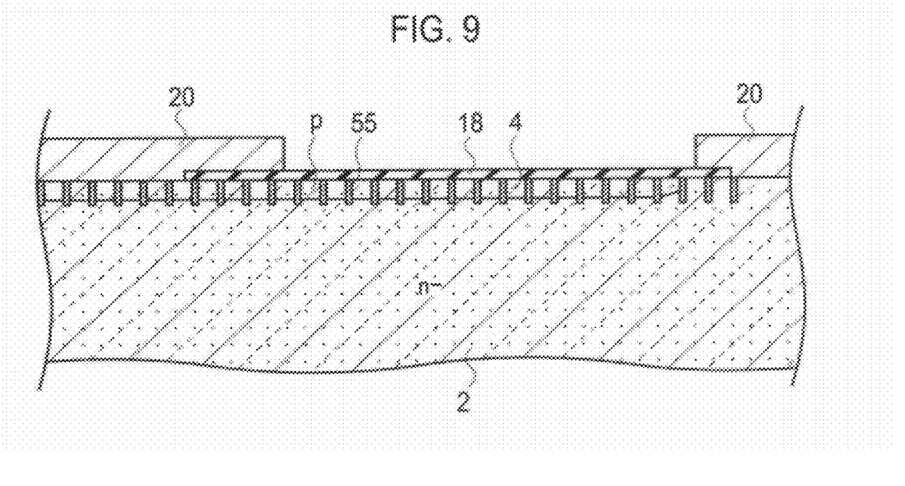
FIG. 9 A schematic cross-sectional configuration diagram of field plate electrode structure, in the junction termination region of the semiconductor device according to the first embodiment of the present invention FIG. 10 A schematic cross-sectional configuration diagram of an extraction electrode connected with a gate electrode composed of a second conductive layer, and a field plate electrode structure connected to the aforementioned extraction electrode, in the junction termination region of the semiconductor device according to the first embodiment of the present invention FIG. 11 A schematic cross-sectional configuration diagram of an extraction electrode structure connected to a plurality of second conductive layers and made by the floating state, in the junction termination region of the semiconductor device according to the first embodiment of the present invention

(c) In the junction termination region of the semiconductor device according to the first embodiment, a schematic cross-section structure of field plate electrode structure is expressed as shown in FIG. 9. That is, as shown in FIG. 9, the field plate electrode structure includes at least an interlayer insulating film 18 disposed on the junction termination region 52 near the element region 51, and a field plate electrode 20 disposed by extending on the interlayer insulating film 18.

The field plate electrode 20 may be made equipotential to the third electrode connected to the emitter region (source region) 10, or may be made equipotential to the gate electrode 8 composed of the first conductive layer in the element region 51.

APSG (Phospho Silicate Glasses) film, a BPSG (Boro-Phospho Silicate Glasses) film, a non-doped silicate glasses film, a silicon nitride film, a polysilicon film, etc. can be used for the interlayer insulating film 18, for example.

The electrical potential change in the location near the element region 51 can be made small, and the electric field can be relaxed, by forming the field plate electrode 20 with an aluminum electrode, for example, and fabricating the field plate electrode 20 on the interlayer insulating film 18 composed of the PSG film etc.

Figure 10:
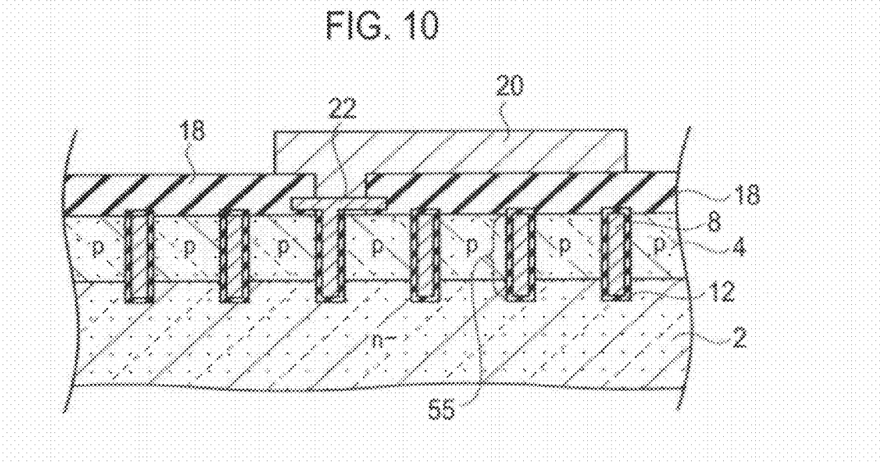

(d) FIG. 10 shows a schematic cross-section structure of a structure composed of the extraction electrode 22 connected to the gate electrode 8 composed of the second conductive layer, and the field plate electrode 20 connected to the aforementioned extraction electrode 22, in the junction termination region 52 of the semiconductor device according to the first embodiment.

That is, the structure includes: the interlayer insulating film 18 disposed on the junction termination region 52; the extraction electrode 22 disposed on the junction termination region 52 via the interlayer insulating film 18, and connected to the gate electrode 8 composed of the second conductive layer; and the field plate electrode 20 extended and disposed on the interlayer insulating film 18, and connected to the extraction electrode 22.

A PSG film, a BPSG film, a non-doped silicate glasses film, a silicon nitride film, a polysilicon film, etc. can be used for the interlayer insulating film 18, for example.

The electrical potential change near the p type base layer 4 under the field plate electrode 20 can be made small, and the electric field can be relaxed, by forming the field plate electrode 20 with an aluminum electrode, for example, and fabricating the field plate electrode 20 on the interlayer insulating film 18 composed of the PSG film etc.

Figure 11:
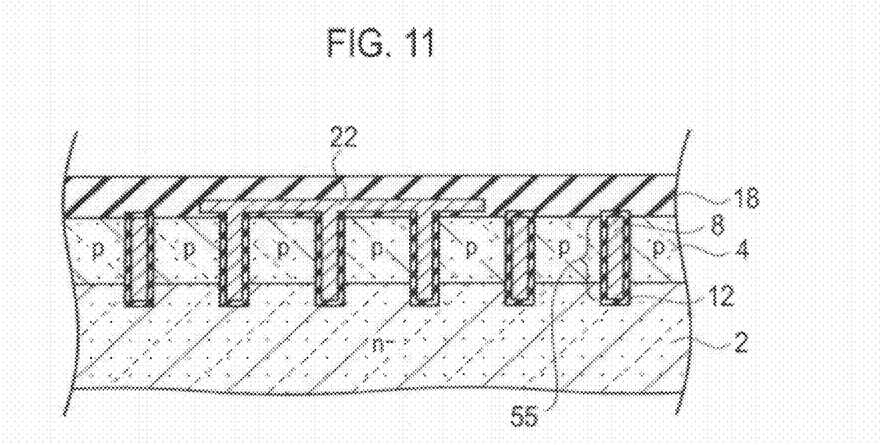

(e) FIG. 11 shows a schematic cross-section structure of a structure of the extraction electrode 22 which is connected to the gate electrodes 8 composed of a plurality of second conductive layers, and is made by the floating state, in the junction termination region of the semiconductor device according to the first embodiment.

That is, the structure includes: the interlayer insulating film 18 disposed on the junction termination region 52; and the extraction electrode 22 connected to the gate electrode 8 disposed via the interlayer insulating film 18 on the junction termination region 52, and composed of a plurality of second conductive layers. The aforementioned extraction electrode 22 is made by the floating state. For example, the gate electrode 8 composed of a plurality of second conductive layers is formed of a polysilicon layer made by the floating state.

The extraction electrode 22 can be formed by connecting polysilicon layers in common, in which the polysilicon layers are made floating state, as shown in FIG. 11.

(f) A high impurity concentration layer may be formed by a diffusion process, in order to terminate the spreading of the depletion layer, in an outermost periphery unit.

(g) It may be provided with a configuration using the gate electrode 8 forming a plurality of terminal trenches 55 of the outermost periphery unit as an EQR (EQui-potential Ring) connected to the $n^-$ base layer 2 or the drain electrode (collector electrode).

(h) A configuration achieving the electric field relaxation may also be provided by fabricating a plurality of the trench columns at the element region 51 side of the boundary between the element region 51 and the junction termination region 52.

(i) Alternatively, a configuration achieving the electric field relaxation may be provided by changing the width of the terminal trench 55 in accordance with the location, in the junction termination region 52.

According to the semiconductor device according to the first embodiment, the electric field in the junction termination region can be relaxed and the high breakdown voltage can be achieved.

Other Embodiments

As mentioned above, the present invention has been described by the first embodiment, as a disclosure including associated description and drawings to be construed as illustrative, not restrictive. With the disclosure, artisan might easily think up alternative embodiments, embodiment examples, or application techniques.

As the semiconductor device according to the first embodiment, although the examples, such as IGBT, MISFET, etc. having the trench structure, are disclosed, it is not limited to the examples and can apply also in device structures, such as IEGT (Injection Enhanced Gate Transistor) and SIT (Static Induction Transistor) and an SI (Static Induction) thyristor having the trench structure.

Furthermore, as the semiconductor material, it is not limited to silicon and can also apply compound semiconductors, such as SiC, GaN based, GaAs based, and InP based, or a base structure of heterojunction, or a channel structure of HEMT structure.

Such being the case, the present invention covers a variety of embodiments, whether described or not.

INDUSTRIAL APPLICABILITY

The semiconductor device of the present invention is applicable in the whole power semiconductor device applied to various kinds of power converters.

The invention claimed is:

1. A semiconductor device comprising
a semiconductor base substance having
   a first semiconductor region having an impurity of a first conductivity type, and
   a second semiconductor region contacting a top surface of the first semiconductor region and having a second conductivity type different from the first conductivity type,
the semiconductor base substance having:
   an element region, on which a switching element is formed;
   a terminal region formed so as to surround the element region when observed from an upper side;
   a trench formed in the depth direction from a top surface of the second semiconductor region of the terminal region;
   an insulating film formed on a sidewall and a bottom surface of the trench; and
   a first conductive layer embedded inside the trench via the insulating film, wherein
the depth of the trench from the top surface of the second semiconductor region to the bottom surface of the trench is 0.9 to 2.0 times the thickness of the second semiconductor region and
a plurality of the trenches are formed on the terminal region so as to traverse the semiconductor device from the element region side toward a termination side when observed from an upper side, and the thickness of the insulating film on the sidewall of the trench in the termination side is thick compared with the thickness of the insulating film on the sidewall of the trench in the element region side.

2. A semiconductor device comprising
a semiconductor base substance having a first principal surface and a second principal surface,
the semiconductor base substance comprising:
   an element region on which a switching element is formed; and
   a terminal region formed so as to surround the element region when observed from an upper side,
the element region having:
   a first semiconductor region having an impurity of a first conductivity type;
   a second semiconductor region contacting a top surface of the first semiconductor region, and having a second conductivity type different from the first conductivity type, a part of the second semiconductor region being exposed in the first principal surface;
   a third semiconductor region contacting a top surface of the second semiconductor region, and having a first conductivity type, a part of the third semiconductor region being exposed in the first principal surface;
   a trench passing through the second semiconductor region and the third semiconductor region from the first principal surface, a bottom surface of the trench reaching to the first semiconductor region;
   a first insulating film formed on a side surface and a bottom surface of the trench;
   a first conductive layer embedded inside the first insulating film;
   a control electrode electrically connected to the first conductive layer;
   a first electrode electrically connected to the first semiconductor region; and
   a third electrode electrically connected to the third semiconductor region, the terminal region having:

a trench formed in the depth direction from a top surface so as to surround the element region, the second semiconductor region being exposed on the top surface;

a second insulating film formed on a sidewall and a bottom surface of the aforementioned trench; and a second conductive layer embedded inside the aforementioned trench via the second insulating film, wherein the depth of the trench from the top surface of the second semiconductor region to the bottom surface of the trench is 0.9 to 2.0 times the thickness of the second semiconductor region, and the following formula is satisfied $$C3, C4 \gg C1, C2$$

where C1 is a capacitor between the second semiconductor region and the first semiconductor region, C2 is a capacitor between the first conductive layer and the first semiconductor region in the trench, and C3 and C4 are capacitors between the first conductive layer and the second semiconductor region, respectively, in each side walls of the trench.

3. The semiconductor device according to claim 1, wherein a plurality of the trenches are formed on the terminal region so as to surround the semiconductor device from the element region side toward a termination side when observed from an upper side, and the interval of adjoining trenches at the termination side is narrow compared with the interval of adjoining trenches at the element region side.

4. The semiconductor device according to claim 3, wherein the interval of the adjoining trenches is larger than the depth of the trench.

5. The semiconductor device according to claim 2 further comprising:

an interlayer insulating film disposed on the terminal region at least near the element region; and a field plate electrode disposed by extending on the interlayer insulating film.

6. The semiconductor device according to claim 5, wherein the field plate electrode is made equipotential to the third electrode.

7. The semiconductor device according to claim 5, wherein the field plate electrode is made equipotential to the control electrode.

8. The semiconductor device according to claim 2 further comprising:

an interlayer insulating film disposed on the terminal region;

an extraction electrode disposed on the terminal region via the interlayer insulating film, and connected to the second conductive layer; and a field plate electrode disposed by extending on the interlayer insulating film, and connected to the extraction electrode.

9. The semiconductor device according to claim 2 further comprising:

an interlayer insulating film disposed on the terminal region; and an extraction electrode disposed on the terminal region via the interlayer insulating film, and connected to the plurality of second conductive layers, wherein the extraction electrode is made by a floating state.

10. The semiconductor device according to claim 2, wherein a plurality of the trenches are formed on the terminal region so as to surround the semiconductor device from the element region side toward a termination side when observed from an upper side, and the interval of adjoining trenches at the termination side is narrow compared with the interval of adjoining trenches at the element region side.

11. The semiconductor device according to claim 2, wherein a plurality of the trenches are formed on the terminal region so as to surround the semiconductor device from the element region side toward termination side when observed from an upper side, and the thickness of the second insulating film at the side surface of the trench in the termination side is thick compared with the thickness of the second insulating film at the side surface of the trench in the element region side.

12. The semiconductor device according to claim 11, wherein the interval of the adjoining trenches is larger than the depth of the trench.

* * * * *